United States Patent [19]
Carney

[11] Patent Number: 5,473,322
[45] Date of Patent: Dec. 5, 1995

[54] APPARATUS AND METHOD FOR SENSING TAMPERING WITH A UTILITY METER

[75] Inventor: Murray C. Carney, Dunwoody, Ga.

[73] Assignee: Schlumberger Industries, Inc., Norcross, Ga.

[21] Appl. No.: 918,105

[22] Filed: Jul. 24, 1992

[51] Int. Cl.[6] .................................................. G08B 23/00
[52] U.S. Cl. ............... 340/870.02; 340/522; 340/870.16; 340/637; 340/689; 324/110; 324/142
[58] Field of Search ..................................... 340/517, 521, 340/531, 825.69, 825.72, 825.16, 870.02, 870.03, 870.16, 637, 689; 379/106, 107; 324/110, 142, 522

[56] References Cited

U.S. PATENT DOCUMENTS

| | | | |
|---|---|---|---|
| 4,001,777 | 1/1977 | Alexander | 340/68 |
| 4,195,286 | 3/1980 | Galvin | 340/522 |
| 4,302,750 | 11/1981 | Wadhwani et al. | 340/870.02 |
| 4,419,758 | 12/1983 | Dorey | 340/825.73 |
| 4,463,354 | 7/1984 | Sears | 340/870.02 |
| 4,542,337 | 9/1985 | Rausch | 340/568 |
| 4,588,949 | 5/1986 | Becker et al. | 340/568 |
| 4,611,197 | 9/1986 | Sansky | 340/522 |
| 4,614,945 | 9/1986 | Brunius et al. | 340/870.03 |
| 4,786,903 | 11/1988 | Grindahl et al. | 340/825.54 |
| 4,799,059 | 1/1989 | Grindahl et al. | 340/870.03 |
| 4,804,957 | 2/1989 | Selph et al. | 340/870.03 |
| 4,850,010 | 7/1989 | Stanbury et al. | 340/870.03 |
| 4,856,054 | 8/1989 | Smith | 340/870.02 |
| 4,862,493 | 8/1989 | Venkataraman et al. | 340/870.02 |
| 5,056,107 | 10/1991 | Johnson et al. | 340/637 |
| 5,086,292 | 2/1992 | Johnson et al. | 340/637 |
| 5,216,410 | 6/1993 | Pildner et al. | 340/522 |

Primary Examiner—John K. Peng
Assistant Examiner—Daniel J. Wu
Attorney, Agent, or Firm—Sanford J. Asman

[57] ABSTRACT

A device for detecting tampering of a utility meter includes sensors to detect a positional displacement of the meter and loss of power to the meter. On sensing a positional displacement of the meter, indicative of an attempt to remove the meter, a timer is activated to enable sensing a power loss to the meter. In response to detection of a power loss during the time period defined by the timer, an indication is stored in a nonvolatile memory of the tamper event. In response to loss of power with or without a detection of tampering, required parameters including utility consumption data are stored in nonvolatile memory. Remote access to and data retrieval from the nonvolatile memory and system are provided over telephone lines, power lines, or a radio frequency circuit.

41 Claims, 5 Drawing Sheets

APPARATUS AND METHOD FOR SENSING TAMPERING WITH A UTILITY METER

FIELD OF THE INVENTION

This invention relates to utility metering systems and, more particularly, to a system and method for detecting and recording tampering with a metering device.

DESCRIPTION OF THE PRIOR ART

Utility meters are used for billing services provided by public utilities such as power, gas and water. For example, watt-hour meters, located at the customer premises, include detachable meter units for measuring and recording electric power consumption by the customer. Typically, an induction-type watt hour meter is provided at each customer location. The induction type watt-hour meter operates on a principle of a rotating magnetic field of an induction motor. Electric power service is routed through the meter in a manner causing a metallic disk to revolve at a rate proportional to power consumption. Disk rotation is counted and recorded mechanically using a mechanical kilowatt hour register and/or electronically with data stored in a conventional semiconductor memory. Meter reading personnel periodically inspect each customer site and record utility meter readings, either by hand or using an electronic probe to retrieve data stored in solid state memory. Billing information is generated based on the data collected by the meter reading personnel.

To increase data collection efficiency and reliability, utility meters are now available which include interface equipment to permit remote interrogation of the meter and transmission of usage data. Connectivity between utility meters located at remote customer sites and a central billing facility can be provided using various media including signals transmitted on power lines, dedicated signalling lines, the public telephone switched network (PTSN) and radio frequency (RF) transmissions. The IMS T 200 Electric Meter Encoder sold by the AMR Division of Schlumberger Industries, Inc., 3155 Northwoods Parkway, Building A, Norcross, Ga., links customer electric utility meters to an automatic meter reading (AMR) system through telephone lines. Other systems for retrieving metering data over telephone lines include Stanbury et al., U.S. Pat, No. 4,850,010, issued Jul. 18, 1989, Smith U.S. Pat. No. 4,720,851, issued Jan. 19, 1988 and 4,856,054, issued Aug. 8, 1989, Verma et al., U.S. Pat. No. 4,833,618, issued May 23, 1989 and Venkataraman et al., U.S. Pat. No. 4,862,493, issued Aug. 29, 1989. The IMS-R100 Radio Frequency Meter also sold by Schlumberger Industries, Inc. provides KWh consumption data from an electromechanical meter to an AMR system over an RF circuit. U.S. patents describing metering systems interrogable using RF links include Grindahl et al., U.S. No. Pat 4,786,903, issued Nov. 22, 1988, 4,799,059, issued Jan. 17, 1989, and Brunius et al., U.S. Pat. No. 4,614,945, issued Sep. 30, 1986, describe automatic and remote instrument monitoring systems using RF transponder units to receive commands and, in response, transmit information from commodity meters for gas, water and electricity. The IMS-I200 Solid State Encoder also sold by Schlumberger Industries, Inc. uses inductive coupling to transmit and receive data and commands. Sears, U.S. Pat. No. 4,463,354, issued Jul. 31, 1984, describes an electronic meter register and a method of remotely communicating with the meter with a portable hand-held transceiver, also using inductive techniques.

As a result of increased utilization of automatic remote reading of utility meters, there has been a decreased frequency of on-site inspection of metering equipment, providing an increased opportunity for undetected tampering with the metering equipment. For example, most single phase and polyphase electricity meters in the United States are socket mounted. Most common methods of tampering with such electricity metering installation involves removing the meter from the meter socket. Once removed, a single phase meter, for example, can be reinstalled upside down resulting in reverse rotation of the internal meter disk and register dials which record cumulative energy consumption.

An earlier generation of conventional induction type watt-hour meter employed a mechanical technique to sense the installation of a meter and a counter sealed beneath the meter cover to record and display the number of times the meter had been removed and reinstalled. Becker et al., U.S. Pat. No. 4,588,949, issued May 13, 1986 describes such a mechanical system for recording tampering. Later generations of induction meters employed orientation sensitive switches (tilt switches) and logic elements to sense common tampering techniques. For example, Grindahl et al. '059 describes a tamper detection apparatus which detects tampering in the form of unauthorized entering into, or movement of the metering and associated equipment. A numerical count representative of a number of instances of such tampering is recorded in a memory.

Although tilt switches have proven effective at sensing removal and reinstallation of meters when reinstalled upside down, these techniques are not able to reliably sense meter removal from a socket when a reasonable attempt is made to maintain the meters in a normal attitude. If the tilt switch is made overly sensitive, then the system will falsely report tampering in response to normal events such as a branch blowing against the meter or other foreign object inadvertently striking the meter or supporting structures. Conversely, if the tilt switch is insufficiently sensitive, then a person observing reasonable precautions can remove the meter from its socket without activating the tamper detection system.

SUMMARY OF THE INVENTION

Accordingly, an object of the invention is to detect tampering of a metering device which will minimize false tamper alerts.

Another object of the invention is to provide a sensitive tamper detection system which is not easily defeated by careful handling of the meter.

Still another object of the invention is to provide a remote indication of meter tampering.

To achieve these objects, the invention senses multiple events associated with removal of a utility meter from a socket to detect and record a tamper condition. In particular, a tilt switch is mounted in the meter in a manner so as to make the switch very sensitive to motion. The tilt switch is connected as an input to an edge triggered logic element so that any momentary change of state of the tilt switch triggers the logic element. A timer is initiated in response to triggering of the logic element to define a power loss sensing time period. An early power failure detection (EPFD) circuit detects an impending loss of DC power to the meter as would be caused by meter removal. The EPFD circuit monitors the AC line supply and supplies an output signal indicating the impending loss of DC power in response to detecting a voltage level below a threshold value. A sensitivity of the EPFD circuitry is responsive to the switching levels of the associated logic components and a time constant of associated power supply filter components. The power supply filter time constant is chosen to store sufficient energy to maintain the DC supply voltage to the logic circuits at an operational level throughout an orderly system shutdown initiated by the EPFD output signaling the impending loss of DC power. If an impending loss of power is sensed during a predetermined time period following activation of the tilt switch, the tamper condition is recorded in nonvolatile memory along with other critical data required to accomplish an orderly system shutdown.

According to one aspect of the invention, an apparatus for detecting a tampering with a metering device includes an early power failure detecting (EPFD) circuit for detecting an imminent loss of power to the metering device and, in response, supplies a power failure warning signal. A position detector detects a displacement of the metering device, and, in response supplies a displacement signal. A timer is responsive to the displacement signal for supplying a tamper detect enable signal of a predetermined duration. Logic circuitry responsive to the power failure warning signal and the tamper detect enable signal indicate a tampering of the metering device. The early power failure detecting circuitry includes a voltage level detector for sensing a level of electric power supplied to the metering device and, in response to detecting a voltage level below a predetermined threshold value, supplies the power failure warning signal. The position detector can detect an orientation or an acceleration of the metering device.

According to another aspect of the invention, a nonvolatile memory is included in which the logic circuitry stores an indication of detecting a tampering of the metering device.

According to another aspect of the invention, the apparatus includes a detector for detecting electrical energy consumption. Each signal from the detector causes the logic circuitry to index an electronic register by a predetermined value, such electronic register containing the total cumulative energy consumed. The logic circuitry stores the energy consumption value in the nonvolatile memory in response to receiving a power failure warning signal.

According to another aspect of the invention, circuitry is provided for transmitting data to an external device including supplying the indication of detecting a tampering and the power consumption values stored in the nonvolatile memory. The data transmission circuitry can include an interface for receiving and transmitting command information and usage data over a telephone line. Alternatively, the data transmission circuitry can include radio transmission and reception circuitry.

According to a method of the invention, tampering of an electrically powered device is detected by detecting a displacement of the device, followed by detecting a loss of power to the device within a predetermined time period. In response to these events, an indication of tampering is provided. Loss of power to the device can be detected by sensing a voltage level of electric power supplied to the device being below a predetermined threshold value. Displacement of the device can be accomplished by detecting an orientation or acceleration of the device. The indication of tampering and electric energy consumption values are stored in nonvolatile memory.

According to another aspect of the invention, a data transmission message supplies the indication of a detected tampering and the energy consumption to an external device in response to a command received from the external device.

These objects and other objects, features, aspects and advantages of the present invention will become more apparent from the following detailed description of the present invention when taken in conjunction with the accompanying drawings.

BEST MODE FOR CARRYING OUT THE INVENTION

Figure 1:
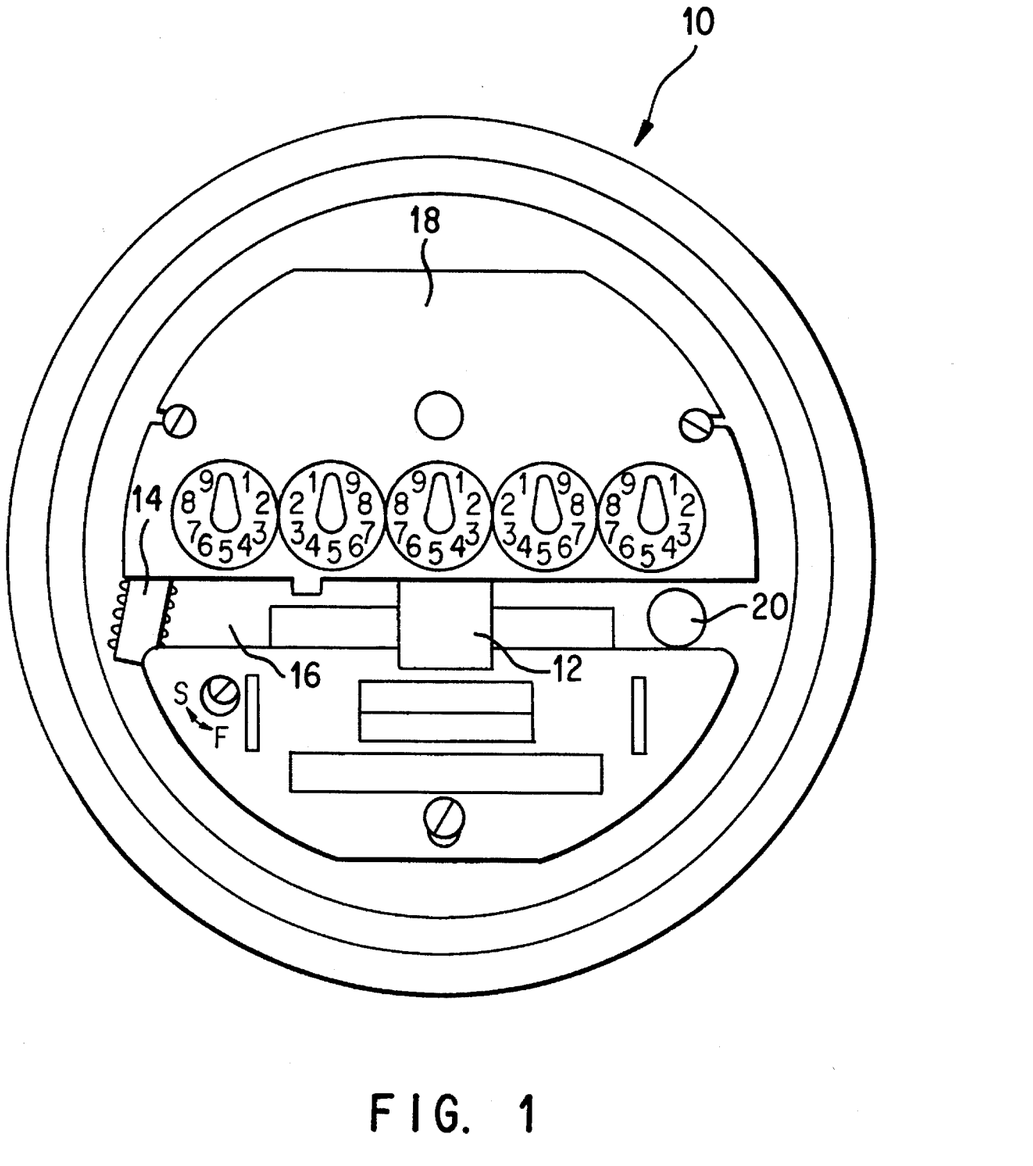
FIG. 1 is a front view of an electric watt-hour meter including a mechanical meter register and tamper detect tilt switch.

Although the invention is adaptable to detect tampering of any equipment the removal of which would cause a loss of power to the equipment, and in particular, utility metering devices, the invention is herein illustrated as embodied in an electric watt-hour meter as shown in FIG. 1.

Single phase induction type watt-hour meter 10 includes a metallic disk (not shown) located behind optical sensor 12. Electric power from a power distribution system is routed through the meter and, in particular, coils located above and below the centrally located metallic disk and then to the customer. Alternating magnetic fluxes produced by the coils establish a current in the metallic disk causing the disk to rotate at a rate proportional to the rate of energy consumption, i.e., in response to the quantity of electric power supplied through the meter. An output of optical sensor 12 is supplied to logic circuitry 14 mounted on circuit board 16 to provide an electrical signal indicating a quantity of energy supplied through the meter. Concurrently, mechanical meter register 18 mechanically counts rotation of the metallic disk to provide an independent readout of consumed energy. Tamper detect tilt switch 20 is mounted on circuit board 16 and provides an output to logic circuitry 14 in response to movement or orientation of meter 10.

Tamper detect tilt switch 20 is a commercially available surface mounted, normally open, mercury tilt switch. The switch has a nominal contact rating of 10 microamps at 3.6 VDC with a maximum contact resistance of 100 ohms. Insulation resistance for the tilt switch should be at least 100 megohms. The switch is activated when tilted at least 60° in any direction from a normal vertical mounting position. Other types of commercially available tilt, motion and position sensing switches may be used.

Figure 2:
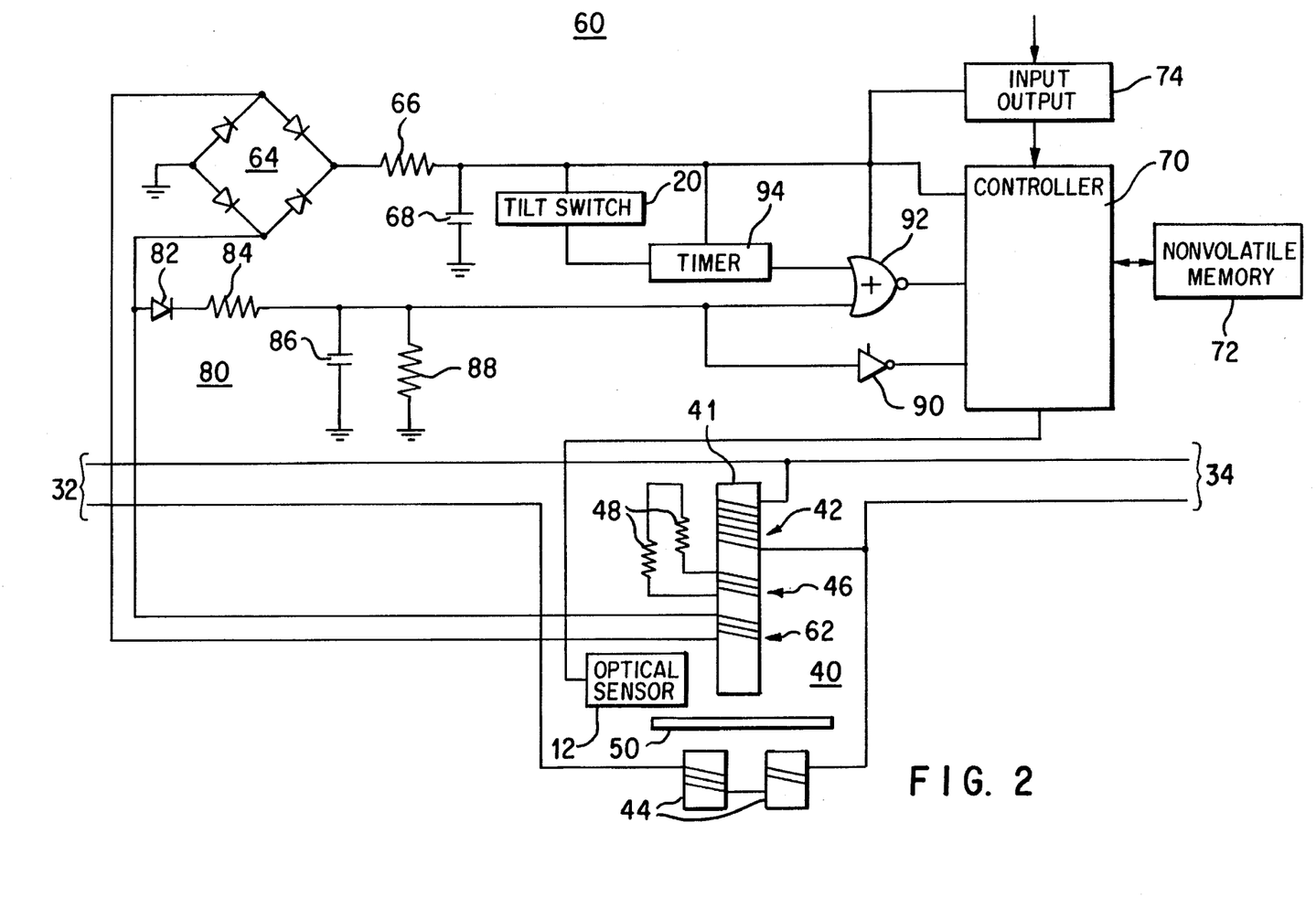
FIG. 2 is a schematic diagram of an electric watt-hour meter including tamper detection circuitry according to the invention.

A hardware implementation of the invention is shown in the schematic diagram of FIG. 2. In the lower half of the figure, an induction type watt-meter 40 receives electric power at input node 32 and supplies power to a customer at output node 34. Potential element 41 includes a potential coil 42 connected in parallel with the power line. Having a large number of turns, potential coil 42 is highly inductive so that the magnetic flux emanating from a potential pole tip of the coil will lag almost 90° behind the applied voltage. In contrast, the fluxes set up by line current in coils 44 are in phase with the current supplied through the meter. In response to application of these alternating magnetic fluxes, a torque is established in metallic disk 50 which is proportional to the power used by the customer. Compensating coil (lag coil) 46 of potential element 41 and lag adjustment resistors 48 are used to compensate for phase quadrature errors. Optical sensor 12 detects rotation of metallic disk 50 and provides a corresponding signal to electric meter encoder 60.

Electric meter encoder 60 includes a DC power supply, early power failure detector 80 and logic and control elements. Low voltage AC is supplied by a secondary winding 62-provided on potential element 41 which is converted to pulsating direct current by bridge rectifier 64. Series resistor 66 together with filter capacitor 68 smooths the pulsating DC current to provide a suitable output level for powering the logic and control elements. Although not shown, other filtering and regulation circuitry and components of conventional design can be incorporated to further reduce ripple and noise components and regulate the output voltage from the power supply. Typically, the output from the power supply is 5 volts DC, depending on the voltage requirements of the associated logic and control circuitry.

The low voltage AC output from secondary winding 62 is also supplied to rectifier diode 82 of EPFD circuitry 80. Pulsating DC from rectifier diode 82 is supplied to series resistor 84, filter Capacitor 86 and shunt resistor 88. Series resistor 84 and shunt resistor 88 form a voltage divider which, together with filter capacitor 86, form an RC network having a predetermined short time constant. That is, filter capacitor 86 rapidly discharges through shunt resistor 88 upon loss of power from rectifier 82 and series resistor 84. A short time constant is chosen so that the logic level applied to invertor 90 and one input terminal of NOR gate 92 transitions to a logic zero state rapidly upon loss of power. This is early power failure detection. Thus, filter capacitor 86 only minimally filters the pulsating DC current provided by rectifier diode 82 so as to maintain a logic high level signal to invertor 90 and NOR gate 92 between pulses. In contrast, power supply filter capacitor 68 provides significant power supply ripple suppression and stores a relatively large charge to provide reserve operational power to the logic and control elements for several milliseconds after loss of primary power. The output from invertor 90 is provided to controller 70 to indicate an imminent power failure. In response, controller 70 stores required parameters and performs an orderly system shutdown prior to loss of reserve operational power to the logic and control circuitry.

In response to movement, tilt switch 20 provides a low level output signal to start operation of timer 94. Timer 94 can be a conventional monostable multivibrator circuit which supplies a low logic level output to NOR gate 92 for a predetermined time period in response to activation of tilt switch 20. The output of NOR gate 92 is provided as a tamper detect signal to controller 70 to indicate an imminent power failure condition immediately preceded by physical meter tampering. Thus, NOR gate 92 provides a positive logic level signal to controller 70 in response to low logic level signals at both of its inputs respectively supplied by timer 94 and early power failure detector circuitry 80.

Although the embodiment depicted in the schematic diagram of FIG. 2 includes a hardware implementation of tamper logic circuitry, these functions can instead be implemented in software by controller 70. A commercial embodiment of the invention uses software implemented logic to minimize component count required to perform the tamper detection function.

Controller 70 can be implemented using commercially available microprocessors. In response to a high level signal from NOR gate 92, controller 70 stores an indication of tampering in nonvolatile memory 72 together with other desired parameters such as energy consumption. Commands to the controller and data from the controller are provided through input/output port 74.

Figure 3:
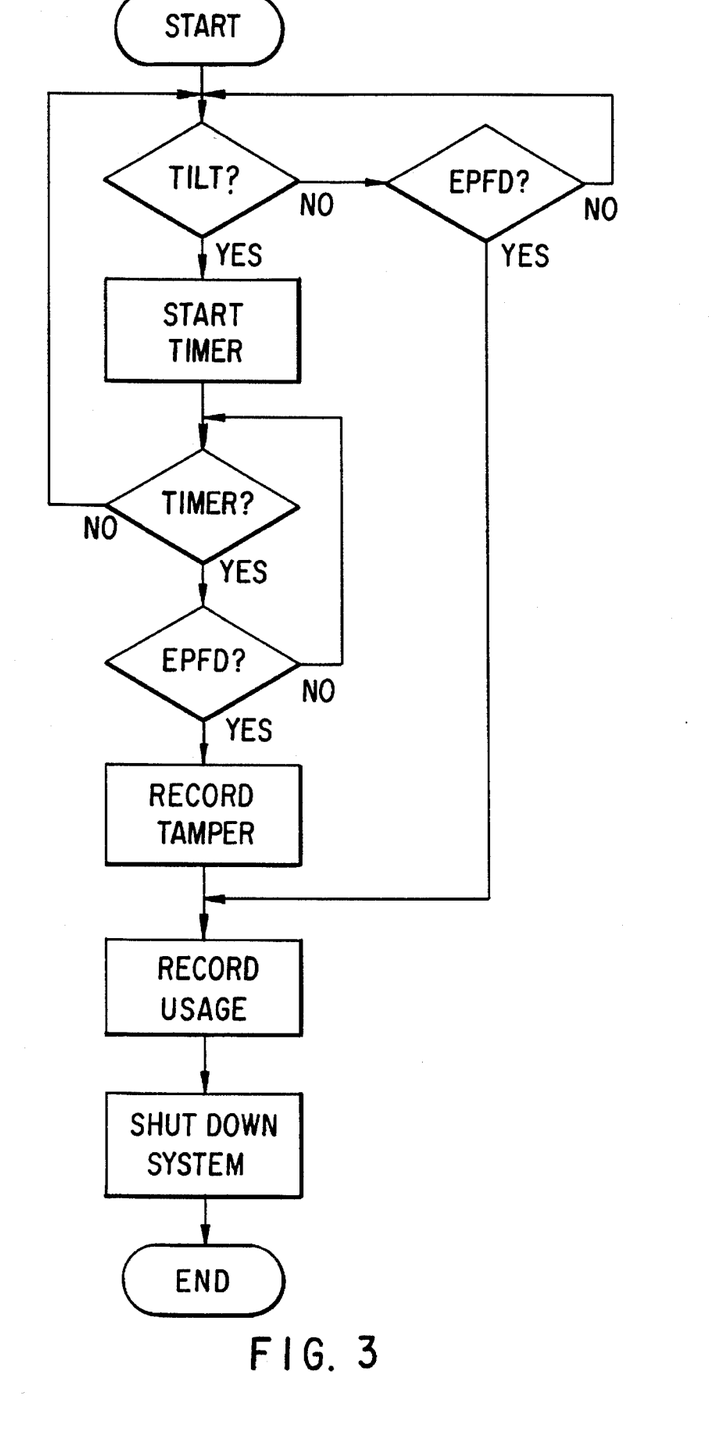
FIG. 3 is a logic flow diagram according to the invention.

System logic flow is diagrammatically shown in the logic flow chart of FIG. 3. The logic sequences shown may be accomplished in hardware or using software implemented logic steps. After system start and initialization, processing control flows to determine if a tilt condition exists, i.e., to test if the meter has been physically displaced. If no physical disturbance is detected, flow is transferred to determine whether an early power failure detection (EPFD) has occurred. If a low voltage level is sensed indicating an imminent power failure, control processing branches to record required parameters including power usage and to perform an orderly system shutdown. If, however, a tilt condition does not exist and there is no indication of an imminent power failure, system processing continues in a testing loop shown at the top of the flow diagram.

If a tilt condition is detected, a software or hardware timer is initiated to run for a predetermined time period. If the timer is implemented in hardware, a conventional monostable multivibrator circuit can be used. Alternatively, a software implemented timer can be implemented using either a system clock or a timing loop.

During the period in which the timer is running, processing continues to test for an indication of an EPFD. If no early power failure is detected, processing continues to test to determine if the timer is running and for subsequent detection of an imminent power failure. If no power failure is detected at the end of the time period, control flows back to restart testing for a tilt condition and to test for a power failure in the absence of a tilt condition.

If a power failure is detected during a predetermined time period after detection of a tilt condition, then the tamper event is recorded in nonvolatile memory, followed by storing of system and usage parameters and system shutdown is then accomplished.

Figure 4:
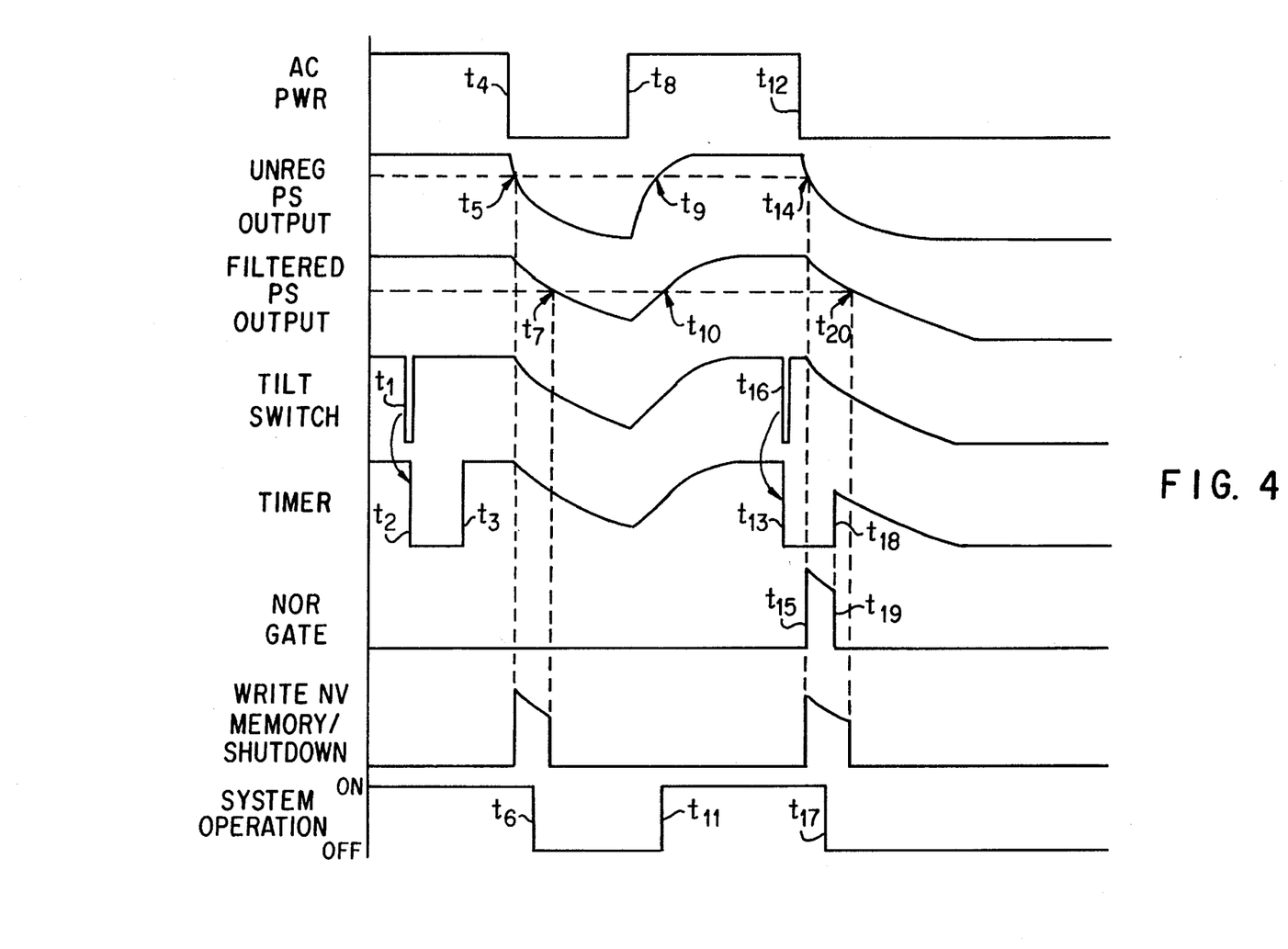
FIG. 4 is a timing diagram illustrating relative signal levels and timing relationships of the power supply and logic components of an electric watt-hour meter of FIG. 2.

FIG. 4 is a timing diagram of the various signal levels present in electric meter encoder 60 as depicted in FIG. 2 during various combinations of power failure and tilt conditions. Referring to FIGS. 2 and 4 together, circuit operation will be described in response to detection of a tilt condition alone, detection of a power failure alone, and detection of a tilt condition immediately followed by loss of AC power as would be expected upon removal of an electric watt-hour meter.

At time t1, a low logic level signal received from tilt switch 20 activates timer 94. Timer 94, in turn, provides a low logic level output signal from time t2 to t3 defining a predetermined time period. Because AC power is not interrupted between t2 and t3, i.e., no power failure is detected by the EPFD circuitry, no tamper message is recorded.

At a time t4, sometime after timer 20 resets, AC power is interrupted to the meter. Because the value of capacitor 86 of EPFD circuit 80 is relatively small, a relatively rapid voltage drop occurs at the output of EPFD circuit 80 beginning at time t4. At a time t5, an output from early power failure detector 80 to invertor 90 falls below a high logic level input, which, in response, provides a high level signal to initiate a write to nonvolatile memory and system shutdown command to controller 70. In response, controller 70 performs system shutdown and system operation is terminated at time t6, prior to the power supply falling below an operational level at time t7. A tamper condition was not recorded in nonvolatile memory because NOR gate 92 maintained a low logic level since tilt switch 20 was not activated in the period of time preceding the EPFD event t5 by the duration of timer 94.

At time t8 AC power is shown restored to the system. Because EPFD circuitry 80 has minimal capacitive filtering, its output rises rapidly, attaining a high logic level signal at t9, followed by the more highly filtered operational power supply reaching an operational voltage level at time t10. To avoid erroneous processing, system operation is inhibited until time t11 when the filtered DC supply voltage has risen above a threshold value assuring predictable system performance.

Circuit operation for detecting an attempt to tamper with a meter by removing it from its socket is shown starting at time t12. Tilt switch 20 detects movement of the meter at time t12, causing timer 94 to begin running and thereby provide a low logic level signal between times t13 and t18. AC power to the meter is removed at time t14, causing the signal from the EPFD circuit to fall to a low logic level at time t15, indicating detection of an imminent loss of regulated DC power. In response to the low level signals supplied by both timer 94 and EPFD circuit 80, NOR gate 92 provides a high logic level output signal to controller 70 at a t15. Controller 70 thereupon initiates writing to nonvolatile memory evidence of the tamper condition in addition to the normal parameters which need to be preserved. To ensure that an orderly system shutdown is accomplished, system shutdown is completed before the regulated supply falls below a level assuring system functionality at time t20.

Figure 5:
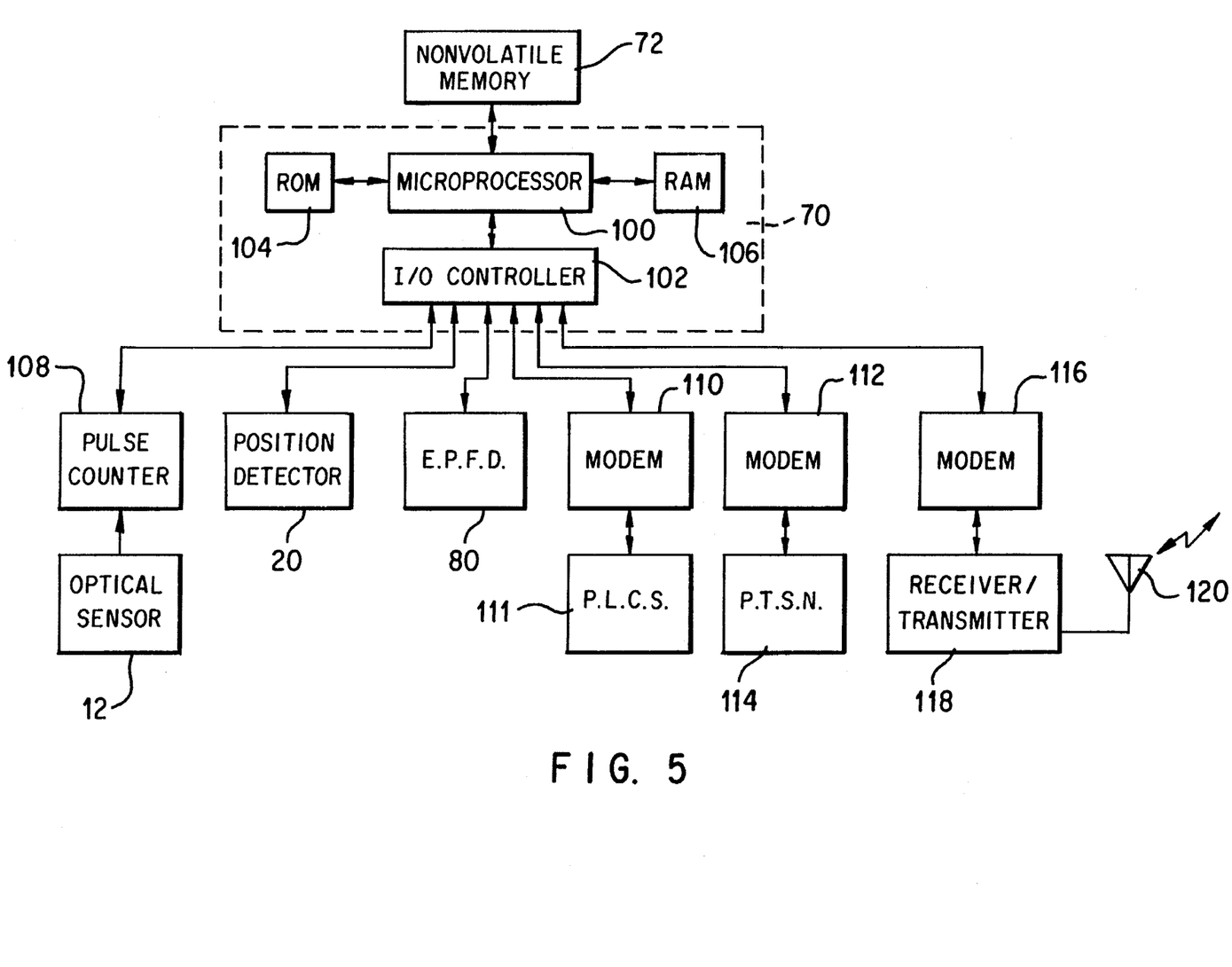
FIG. 5 is a block diagram of logic circuitry interfaced to tamper detectors and communications gateways.

Alternate architecture together with further aspects of the invention are shown in the block diagram of FIG. 5. Controller 70 includes a microprocessor 100 and input-output (I/O) controller 102 for interfacing with peripheral circuits and devices. An operational program to be performed by microprocessor 100 for implementing the logic shown in FIG. 3 is contained in ROM 104. Temporary storage of system parameters and calculations is provided by RAM 106.

Rotation of metallic disk 50 of the induction-watt-hour meter is detected by optical sensor 12 which provides a corresponding series of pulses to counter 108, the stored count representing power consumption data. Power consumption data stored in pulse counter 108 is provided to microprocessor 100 through I/O controller 102 under program control. Outputs from position detector 20 and EPFD circuitry 80 are also provided as inputs to microprocessor 100 to initiate parameter storage in response to detection of an imminent power failure and to record system tampering.

Remote access to the meter and control circuitry is available through power line carrier system modem 110 over a power line carrier system (P.L.C.S.), shown as block 111 or through telephone modem 112 over the public telephone switched network (PTSN) shown as block 114. Alternatively, a radio modem 116 provides control and data conductivity to microprocessor 100 using RF receiver/transmitter 118 (which may be replaced by just a transmitter for a one-way system) and antenna 120. Data supplied to an AMR system includes a data preamble, meter identification number, energy consumption, tamper status and a cyclic redundancy code (CRC) error check or other error detection mechanism.

Although the present invention has been described and illustrated in detail, it is clearly understood that the same is by way of illustration and example only and it is not to be taken by way of limitation, the spirit and scope of the present invention being limited only by the terms of the appended claims. For example, although the invention as illustrated incorporated into a single phase induction type electric watt-hour meter, it is equally applicable to deter and detect tempering of other types of electric watt-hour meters including polyphase induction and single polyphase solid state watt-hour meter, other utility meters and remotely monitored equipment.

I claim:

1. An apparatus for detecting tampering with a metering device, comprising:

(a) an early power failure detecting means for detecting a loss of power to said metering device, said early power failure detecting means generating an early power failure detect signal, $S_{EPFD}$, in response to detection of loss of power to said metering device;

(b) a movement detection means for detecting movement of said metering device, said movement detection means supplying, in response to the detection of movement of said metering device, a movement signal;

(c) timer means for supplying a power failure detect enable signal, $S_{PFDE}$, of a predetermined time duration in response to receipt of said movement signal; and (d) a logic means for providing a tamper detect output in response to receipt by said logic means of both of said power failure detect signal, $S_{EPFD}$, and said power failure detect enable signal, $SP_{PFDE}$, whereby said tamper detect signal can only be generated by the detection of movement of said metering device within a time period corresponding to said predetermined time duration which follows the detection of movement of said metering device.

2. The apparatus of claim 1 wherein said early power failure detecting means includes means for detecting a voltage level of electric power supplied to said metering device and, in response to detecting a voltage level below a predetermined threshold value, supplying said early power failure detect signal.

3. The apparatus of claim 1 wherein said movement detection means detects a change of orientation of said metering device.

4. The apparatus of claim 1 wherein said movement detection means detects an acceleration of said metering device.

5. The apparatus of claim 1 wherein said movement detection means includes a mercury tilt switch.

6. The apparatus of claim 1, further comprising nonvolatile memory means, wherein said logic means stores an indication of receipt of said tamper detect output in said nonvolatile memory means.

7. The apparatus of claim 6, further comprising energy consumption detection means for detecting an electrical energy consumption and, in response, supplying to said logic means an energy consumption signal representing an energy consumption value, said logic means storing said energy consumption value in said nonvolatile memory means in response to said early power failure detect signal.

8. The apparatus of claim 7 further comprising data transmission means for supplying said indication of detecting a tampering and said power consumption value from said nonvolatile memory means to an external device.

9. The apparatus of claim 8 wherein said data transmission means includes interface means for receiving command information data over a telephone line and supplying said indication of receipt of said tamper detect output and said power consumption value over said telephone line.

10. The apparatus of claim 8 wherein said data transmission means includes radio transmission means for supplying a radio signal including said indication of receipt of said tamper detect output.

11. The apparatus of claim 8 wherein said data transmission means includes radio transmission means for supplying a radio signal including said power consumption value.

12. The apparatus of claim 8 wherein said data transmission means includes a power line carrier system.

13. The apparatus of claim 8 wherein said data transmission means includes:

(a) means for receiving a radio command signal; and (b) means for transmitting a radio signal including said indication of detecting a tampering and said power consumption value in response to receipt of said radio command signal.

14. The apparatus of claim 7, wherein said power consumption detection means comprises an induction-type watt-hour meter.

15. The apparatus of claim 14 wherein said induction-type watt-hour meter includes a disk which is rotatable in response to an electrical power consumption, said power consumption detecting means further comprising optical sensing means for detecting a rotation of said disk.

16. A method of detecting tampering of an electrically powered device, including the steps of:

(a) detecting a displacement of said electrically powered device, and generating a power failure detect enable signal having a predetermined time duration in response thereto;

(b) detecting a loss of power to said electrically powered device, and generating an early power failure detect signal in response thereto; and (c) providing an indication of tampering in response to detecting both said power failure detect enable signal and said early power failure detect signal within said predetermined time duration after detecting displacement of said device.

17. The method of claim 16 wherein said step of detecting a loss of power to said electrically powered device includes:

(a) establishing a predetermined threshold value as being indicative of the imminent loss of power to said electrically powered device; and (b) detecting a voltage level of electric power supplied to said electrically powered device being below said predetermined threshold value.

18. The method of claim 16 wherein said step of detecting a displacement of said device includes detecting a change in orientation of said electrically powered device.

19. The method of claim 16 further comprising storing an indication of detecting a tampering with said electrically powered device in a nonvolatile memory.

20. The method of claim 16, further comprising:

(a) detecting an electrical power consumption value; and (b) storing said power consumption value in said nonvolatile memory means.

21. The method of claim 16, further comprising transmitting data indicative of detecting a tampering with said electrically powered device and said power consumption value from said nonvolatile memory means to an external device.

22. The method of claim 21, further comprising receiving a command signal from an external device and, in response, performing said data transmitting step.

23. The apparatus of claim 1, further comprising a reserve power supply for providing said logic means with operational power notwithstanding the loss of power to said metering device.

24. The method of claim 16, further comprising the step of supplying a reserve power to said electrically powered device notwithstanding the loss of power to said electrically powered device.

25. An apparatus for detecting tampering with a metering device, comprising:

(a) early power detecting means for detecting a loss of power to said metering device and, in response, supplying a power failure warning signal;

(b) position detection means for detecting a displacement of said metering device and, in response, supplying a displacement signal;

(c) timer means responsive to said displacement signal for supplying a power failure detect enable signal of a predetermined duration; and (d) logic means responsive to said power failure warning signal and said power failure detect enable signal for indicating a tampering of said metering device when said power failure detect enable signal is followed by said power failure warning signal within said predetermined time duration.

26. The apparatus of claim 7 further comprising data transmission means for supplying said indication of detecting a tampering and said power consumption value from said nonvolatile memory means to an external device.

27. The apparatus of claim 26 wherein said data transmission means includes interface means for receiving command information data over a telephone line and supplying said indication of receipt of said tamper detect output and said power consumption value over said telephone line.

28. The apparatus of claim 26 wherein said data transmission means includes radio transmission means for supplying a radio signal including said indication of receipt of said tamper detect output.

29. The apparatus of claim 28 wherein said data transmission means includes means for receiving a radio signal and then transmitting a radio signal including said indication of receipt of said tamper detect output.

30. The apparatus of claim 26 wherein said data transmission means includes radio transmission means for supplying a radio signal including said power consumption value.

31. The apparatus of claim 30 wherein said data transmission means includes radio transmission means for receiving a radio signal and then transmitting a radio signal including said power consumption value.

32. The apparatus of claim 26 wherein said data transmission means includes a power line carrier system.

33. A method of detecting tampering of an electrically powered device, including the steps of:

(a) detecting a displacement of said electrically powered device;

(b) generating a power failure detect enable signal in response to said step of detecting a displacement of said electrically powered device; said power failure detect enable signal having a predetermined time duration;

(c) detecting an imminent loss of power to said electrically powered device and generating an early power failure detect signal in response thereto; and (d) providing an indication of tampering in response to the concurrent detection of said power failure detect enable signal and said early power failure detect signal within said predetermined time duration after detecting displacement of said device.

34. The method of claim 33 wherein said step of detecting an imminent loss of power to said electrically powered device includes the step of detecting a voltage level of electric power supplied to said electrically powered device being below a predetermined threshold value.

35. The method of claim 33 wherein said step of detecting a displacement of said device is accomplished by detecting a change in the orientation of said electrically powered device.

36. The method of claim 33 wherein said step of detecting a displacement of said device is accomplished by detecting an acceleration force acting on said electrically powered device.

37. The method of claim 33 further comprising storing an indication of detecting a tampering of said device in a nonvolatile memory.

38. The method of claim 37, further comprising:

(a) detecting an electrical power consumption value; and (b) storing said electrical power consumption value in said nonvolatile memory means.

39. The method of claim 38, further comprising transmitting said indication of detecting a tampering and said power consumption value from said nonvolatile memory means to an external device.

40. The method of claim 38, further comprising:

(a) receiving a command signal from an external device; and (b) transmitting said indication of detecting a tampering and said power consumption value from said nonvolatile memory means to said external device.

41. The method of claim 40 wherein said steps of receiving and transmitting are conducted using radio frequency transmissions from said external device and from said electrically powered device.

* * * * *